United States Patent [19]

Phillips

[11] 3,906,486

[45] Sept. 16, 1975

[54] BIPOLAR DUAL-RAMP ANALOG-TO-DIGITAL CONVERTER

[75] Inventor: Berry W. Phillips, Newtonville, Mass.

[73] Assignee: Analog Devices, Incorporated, Norwood, Mass.

[22] Filed: July 2, 1973

[21] Appl. No.: 375,683

Related U.S. Application Data

[63] Continuation of Ser. No. 304,733, Nov. 8, 1972, abandoned.

[52] U.S. Cl. .................... 340/347 NT; 340/347 AD

[51] Int. Cl. .......................................... H03k 13/20

[58] Field of Search .............. 340/347 NT, 347 AD; 324/99 D; 235/183

[56] References Cited

UNITED STATES PATENTS 3,750,146 7/1973 Lucas .......................... 340/347 NT

*Primary Examiner*—Charles D. Miller

*Attorney, Agent, or Firm*—Parmelee, Johnson & Bollinger

[57] ABSTRACT

A bipolar dual ramp analog to digital converter, of the type having an analog processing stage for integrating, in succession, an analog input voltage (ramp up) and a reference voltage (ramp down), is characterized by a referencing circuit which develops balanced reference voltages to correspond to either polarity of the analog input voltage.

In the referencing circuit, linear elements refer all voltages applied to the analog processing stage to a single reference voltage source. A capacitor couples the analog input voltage to the analog processing stage, and switch means connect the reference voltage source across the capacitor to charge it to the voltage of the source. During the ramp up interval, the analog input voltage is connected in series with the charged capacitor and analog processing stage. Derivative voltages are linearly derived from the reference voltage source by means of conductors or resistive voltage dividers, and during the ramp down interval switch means connect one of the derivative voltages to the analog processing stage to form a first reference voltage when the analog input has one polarity, and connect the other of the derivative voltages in series with the capacitor and the analog processing stage to form a second reference voltage when the analog input has the other polarity.

12 Claims, 6 Drawing Figures

BIPOLAR DUAL-RAMP ANALOG-TO-DIGITAL CONVERTER

This is a continuation of application Ser. No. 304,733, filed Nov. 8, 1972, and now abandoned.

BACKGROUND OF THE INVENTION

1. Field of the Invention

This invention relates to bipolar dual ramp analog to digital converters, such as are used in digital voltmeters, and which are of the type arranged to provide a digital output corresponding to the magnitude and polarity of an analog input voltage. Such dual ramp converters have an analog processing stage including an integrator and a comparator. The analog input voltage is applied to the integrator for a predetermined interval determined, e.g., by a counting programmer to "ramp up" the integrator. Thereafter a reference voltage, selected to correspond to the polarity of the analog input voltage, is applied to the integrator for a digitally measured interval to restore the integrator to its initial condition, or to "ramp down" the integrator. The comparator senses the return of the integrator to the initial condition and signals the end of the digitally measured interval, the count on the measuring device digitally representing the magnitude of the analog input voltage.

In bipolar converters adapted to provide a reading for either polarity of an analog input voltage, it is necessary to have multiple reference voltages to cause the integrator to return to its initial condition irrespective of whether the polarity of the analog input has caused a positive going or negative going integration.

2. Description of the Prior Art

Several techniques are known for supplying multiple reference voltages in bipolar dual ramp analog to digital converters. One technique, disclosed in U.S. Pat. No. 3,623,073 to Wheable et al., relies on the presence of two independent reference voltage sources. Such a bipolar source is relatively expensive and moreover the two voltages may tend to drift independently to cause the converter to have different transfer characteristics for different input polarities. In a digital voltmeter, such a converter would give different readings for a single analog voltage depending upon the polarity of the connection of the meter's terminals.

According to another technique, during the ramp up interval the analog input voltage is biased by different reference voltages provided by charging a capacitor to different levels through a feedback loop from the comparator output. This technique, however, is not fully satisfying for certain converter applications.

SUMMARY OF THE INVENTION

Objects of the present invention are to provide a referencing circuit for a bipolar dual ramp analog to digital converter which is insensitive to feedback loop voltages, which is insensitive to drift in voltage sources, and which permits the converter to have a transfer characteristic independent of polarity.

According to the invention, the referencing circuit connects the analog input voltage to the analog processing stage and comprises a capacitor coupling the analog input voltage to the analog processing stage, a reference voltage source, and switch means (such as FET switches) for connecting the reference voltage source across the capacitor to charge it to a voltage linearly related to the voltage of the reference voltage source, and for thereafter disconnecting the capacitor.

During the "ramp up" interval, switch means connect the analog input voltage to the capacitor, and the analog input voltage is biased by the capacitor voltage as it is applied to the analog processing stage. Means such as conductive leads or a resistive voltage divider derive from the reference voltage source a pair of derivative voltages linearly related thereto. Switch means connect one of the derivative voltages to the analog processing stage to form a first reference voltage when the analog voltage is of one polarity and connect the other of the derivative voltages to the analog processing state in series with the capacitor to be biased thereby, to form a second reference voltage when the analog input voltage is of the other polarity. In the referencing circuit described, all voltages applied to the analog processing stage are referred directly or linearly to a single voltage source and any drift or deviations therein or in the analog processing stage become balanced over the course of an integrating cycle.

Other objects, aspects and advantages of the invention will be pointed out in, or apparent from, the detailed description hereinbelow, considered together with the following drawings.

DESCRIPTION OF THE PREFERRED EMBODIMENTS

Figures 1, 2:
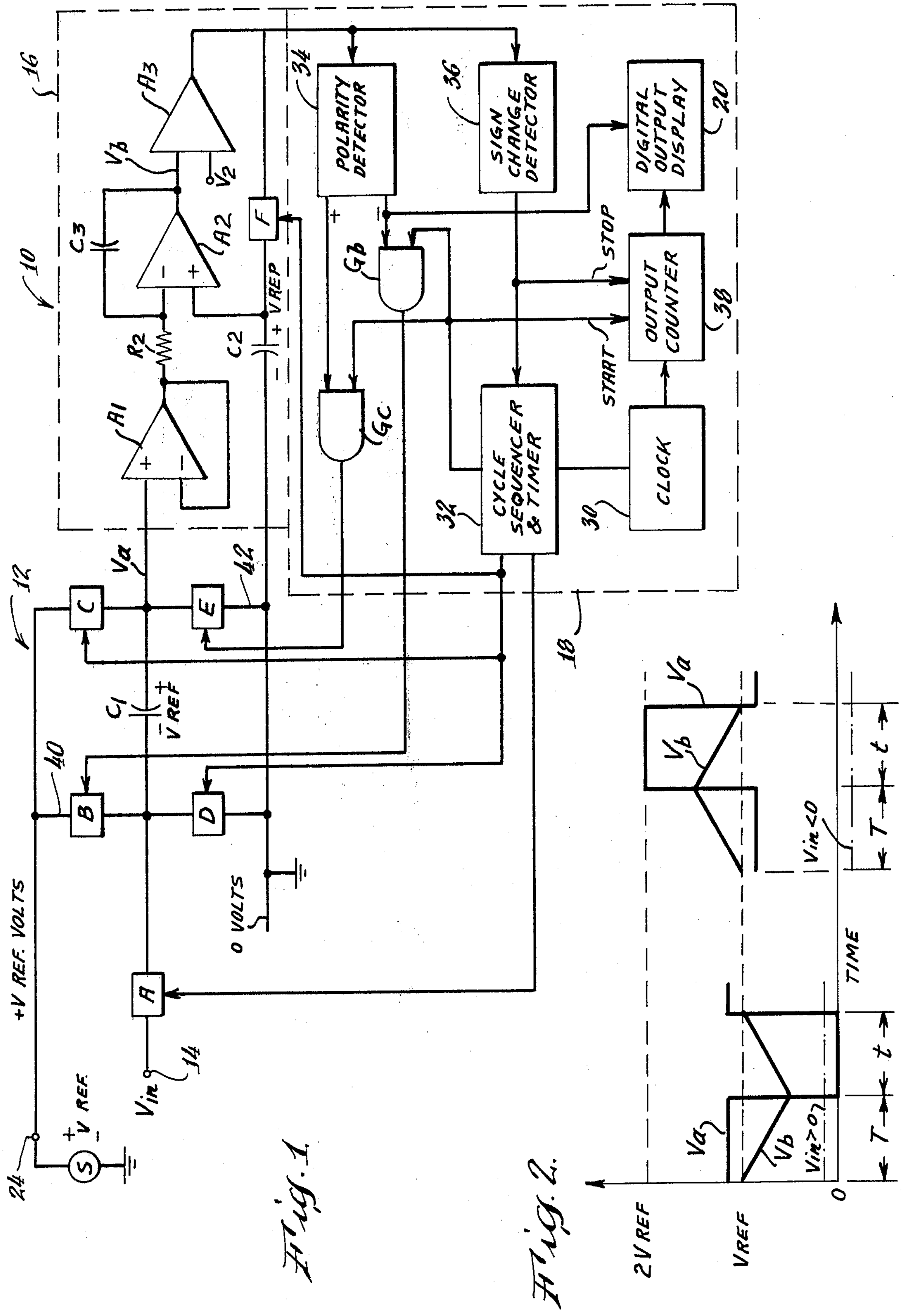
FIG. 1 is a schematic diagram of a bipolar dual ramp analog to digital converter having a referencing circuit according to the present invention.
FIG. 2 is a graph illustrating waveforms at selected points in the circuit of FIG. 1.

FIG. 1 illustrates a bipolar dual ramp analog to digital converter 10 incorporating a referencing circuit 12 in accordance with the present invention. The converter 10 includes an input terminal 14 to which an analog input voltage V*in* is applied, a conventional analog processing stage 16 arranged to integrate and compare analog signals, and a conventional programming and timing circuit 18 arranged to control switches which connect the analog input voltage V*in* and the reference voltages to the analog processing stage 16, to time the predetermined interval of integration during which the converter ramps up, to count the length of the interval during which the reference voltage causes the converter to ramp down, and to provide a reading at a digital output 20 which corresponds in magnitude and polarity to the analog input voltage V*in*.

As shown in FIG. 1, the analog processing stage 16 comprises an input buffer amplifier A1 formed by an operational amplifier with a short circuited feedback loop. The output of buffer amplifier A1 is supplied through a resistor R2 to the inverting terminal of an integrating operational amplifier A2 having a capacitor C3 in its feedback loop, and a capacitor C2 connected between its non-inverting input terminal and ground. The output of integrating amplifier A2 is applied to one input of a comparator A3 having a bias voltage V2 at its other input. A switch or gate F, such as a field effect transistor switch, connects the output of comparator A3 to the non-inverting terminal of integrating amplifier A2 to provide drift compensation in accordance with known techniques.

The referencing circuit 12 of the present invention connects the analog voltage V*in* at terminal 14 to the analog processing stage 16. As shown, referencing circuit 12 comprises a capacitor C1 connected in series between the analog input voltage V*in* at terminal 14 and the analog processing stage 16. A single reference voltage source S supplying a DC voltage of V*ref* is connected between input terminal 24 and ground. Voltages of V*ref* and zero are derived from the reference voltage source S by means of conductors 40 and 42 connected to input terminal 24 and ground respectively. Gates or switches A through E, for example, field effect transistor switches, are opened or closed in the manner described below to provide a pair of reference voltages and to connect the analog input voltage V*in* and the reference voltages to the analog processing stage 16.

Switches C and D are arranged, when closed, to connect the reference voltage source S across the capacitor C1 to charge it to the voltage V*ref* supplied by reference voltage source S. When opened, switches C and D disconnect capacitor C1 completely from voltage source S and permit it to be connected to other elements.

Switch A, in response to signals from programmer circuit 18, closes to connect the analog voltage V*in* through capacitor C1 to the analog processing stage 16 during the predetermined interval in which integrator A2 ramps up. Switches C and D are connected to source S and capacitor C1 with a polarity such that the voltage developed across capacitor C1 biases the voltage V*in* at terminal 14 upwardly by the voltage V*ref*. During the ramp up interval, the voltage V*a* at the input to the analog processing stage 16 is thus:

$$Va = Vin + Vref.$$

Switches B and E are arranged to supply the desired reference voltages to analog processing stage 16 in the interval in which the converter 10 ramps down. As shown, switch E connects the ground voltage derived by conductor 42 to the analog processing stage 16 to provide a first reference voltage of 0 volts when the polarity of the analog input voltage V*in* is positive. Switch B connects the derivative voltage V*ref* derived by conductor 40 to the analog processing stage 16 through the capacitor C1, thereby providing a second reference voltage of 2 V*ref* when the polarity of the analog input voltage V*in* is negative. During the ramp down interval the voltage V*a* at the input to the analog processing stage 16 is thus:

$$Va = 0 \text{ for } Vin > 0$$

$$Va = 2\ Vref \text{ for } Vin < 0$$

Since the analog input voltage V*in* is biased by +V*ref*, it is therefore centered between the positive and negative reference voltages of 0 and 2 V*ref*. As a result, the converter 10 will have the same transfer characteristic whether the analog input is positive or negative. Since all voltages connected to analog processing stage 16 are referred to the same source voltage V*ref*, any drift in the source will not affect the transfer characteristic. Moreover, any drift in the source will affect the ramp up and ramp down rates of integration equally and drift errors will tend to cancel.

During each cycle of the converter 10, switches A through F are opened and closed in predetermined sequence by programming and timing circuit 18 acting in response to an internal clock pulse source 30 supplying a clock signal to sequencing and timing logic 32, and in response to an input from comparator A3. The programming and timing circuit 18 is arranged to accomplish the following operations in each converter cycle:

1. Switches C, D and F are closed simultaneously while the other switches are opened (a) to charge capacitor C1 to the level of reference voltage V*ref*, and (b) to charge capacitor C2 to the level of reference voltage V*ref*, adjusted by a small amount in accordance with known techniques to compensate for drift. Closure of switch C causes the voltage V*ref* to be applied to the inverting terminal of amplifier A2. Feedback from the output of amplifier A3 through closed switch F then drives the inputs of amplifier A2 toward equality, and capacitor C2 is charged to V*ref* plus or minus a small voltage reflecting accumulated amplifier drift.

2. At the beginning of an integration cycle, switches C, D and F are opened and switch A is closed to connect the analog voltage V*in* to analog processing stage 16 through capacitor C1. Switch A is closed for a fixed time T determined by sequencing and timing circuit 32. The output voltage V*b* of integrator A2 during the time T will be a ramp increasing or decreasing, depending on the polarity of voltage V*in*, at a rate depending on the magnitude of V*in* (See FIG. 2). A polarity detector 34 determines from the output of comparator A3 whether V*in* is positive or negative, and supplies this information to gates G*e* and G*b* for use in determining whether switch B or switch E is to be closed during the ramp down interval in response to a timing signal from the sequencing and timing circuit 32. As shown, polarity detector 34 is also connected to supply a plus or minus sign to digital output 20. Polarity detector 34 is of conventional design, a suitable example thereof being given in the Wheable patent, cited above.

3. At the end of time T, switch A is opened and either switch B or switch E is closed depending upon the polarity detector 34. Referring to FIG. 2, if V*in* is positive, then a downwardly sloping ramp will be produced at the output of integrator A2, and switch E is closed to produce a voltage of 0 volts at the input of analog processing stage 16; conversely, if V*in* is negative, an increasing ramp is produced and switch B is closed to provide a voltage of 2 V*ref* at the input of analog processing stage 16. In either case, switch B or switch E remains closed for a time T ending when integration has proceeded sufficiently in the opposite direction to return the integrator A2 to its initial condition, which will flip the output of comparator A3. The change in output of comparator A3 is detected by a sign change detector 36 supplied for example by a zero crossing gate, which stops a counter 38 in programming and timing circuit 18 which began counting when switch B or switch E was closed. The end count is displayed at output 20 as a number corresponding to the absolute value of the voltage V*in*, together with a sign to indicate its polarity.

Figure 3:
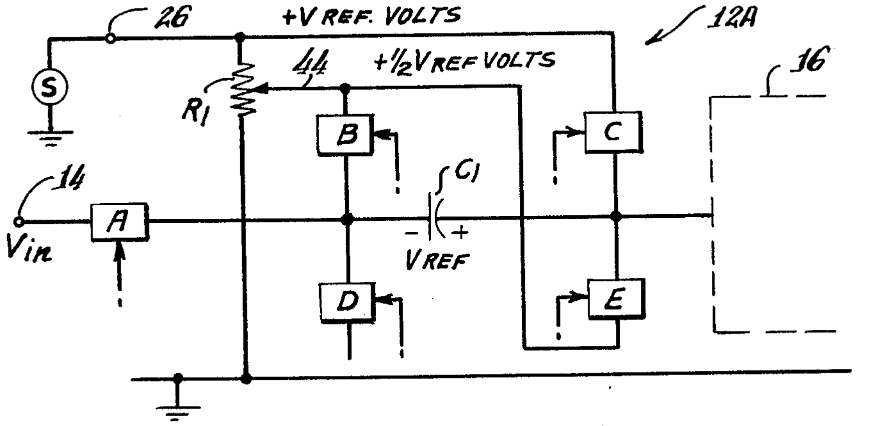
FIG. 3 is a schematic diagram illustrating another referencing circuit according to the present invention.
Figure 4:
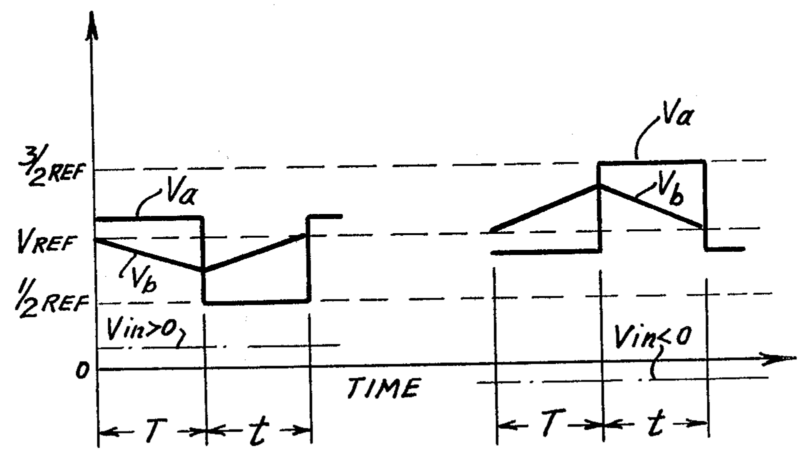
FIG. 4 is a graph, similar to FIG. 2, showing waveforms obtaining with the referencing circuit of FIG. 3.

FIG. 3 illustrates another referencing circuit 12A in accordance with the present invention. However, instead of deriving voltages which are linearly related to the voltage V*ref* of source S by means of conductors connected directly to the source, as in referencing circuit 12 of FIG. 1, referencing circuit 12A connects a potentiometer R1 across the source S to act as a resistive voltage divider and to derive voltages of ½ V*ref* at its output tap 44. Both switches B and E are connected to output tap 44, and thus the two derivative voltages switched into the circuit by switches B and E are each ½ V*ref*. The two reference voltages applied to analog processing stage 16 are therefore ½ V*ref* and 3/2 V*ref*, both linearly related to V*ref*. The biasing voltage provided by capacitor C1 remains V*ref*, and hence the input voltage is again centered between the two reference voltages, and the transfer characteristic of the converter will not depend on polarity of the analog input signal V*in*. Again, since all voltages applied to the analog processing circuit are referred to the single voltage V*ref*, drift effects cancel. Typical waveforms of the voltages V*a* and V*b* in a circuit incorporating referencing circuit 12A are illustrated in FIG. 4.

Figure 5:
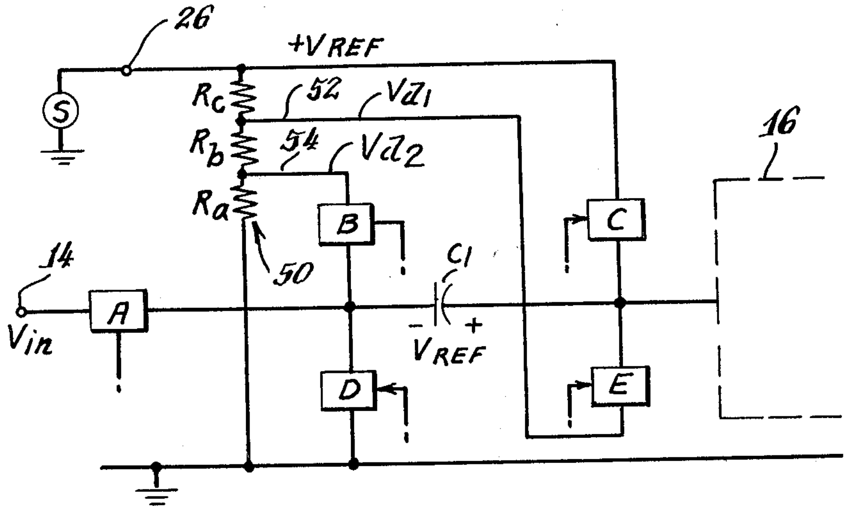
FIG. 5 is a schematic diagram illustrating another referencing circuit according to the invention.
Figure 6:
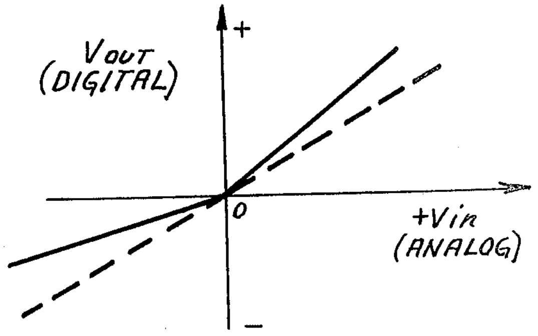
FIG. 6 is a transfer characteristic for a converter having the referencing circuit of FIG. 5.

FIG. 5 illustrates still another referencing circuit 12B, designed to provide a different transfer characteristic for positive and negative analog input voltages V*in*. Instead of potentiometer R1 with a single centered output tap 44 as in referencing circuit 12A of FIG. 3, referencing circuit 12B has a resistive voltage dividing circuit 50 comprising series resistors R*a*, R*b*, and R*c*, with intermediate taps 52 and 54 carrying to switches E and B derivative voltages V*d*1 and V*d*2 which are linear fractions of V*ref*. Accordingly, when switch E is closed, the first reference voltage will be V*d*1. When switch B is closed, the second reference voltage will be V*d*2 + V*ref*. Since V*d*1 and V*d*2 are unequal, and since capacitor C1 still carries a biasing voltage of V*ref*, the analog input is not balanced between the reference voltages, and a transfer characteristic as illustrated in solid lines in FIG. 6 will result, in which the slope of the characteristic for positive V*in* is different from the slope for negative V*in*. In contrast, the referencing circuits 12 and 12A produce a characteristic with uniform slope, as shown in dashed lines in FIG. 6. As in referencing circuits 12 and 12A, referencing circuit 12B refers all voltages applied to the analog processing stage 16 to the single voltage V*ref*, and any drift errors tend to cancel.

Although specific embodiments of the invention have been disclosed herein in detail, it is to be understood that this is for the purpose of illustrating the invention, and should not be construed as necessarily limiting the scope of the invention, since it is apparent that many changes can be made to the disclosed structures by those skilled in the art ot suit particular applications.

I claim:

1. A bipolar dual-ramp analog-to-digital converter of the type arranged to provide a digital output corresponding to the magnitude and polarity of an analog input voltage and including an analog processing stage having an integrator and comparator, the analog input voltage being applied to the integrator for a predetermined interval, and a reference voltage being applied to the integrator thereafter for a digitally measured interval sufficient to restore the integrator to its initial condition, the comparator sensing the return of the integrator to the initial condition and signalling the end of the digitally measured interval, said converter being characterized by a reference circuit connecting the analog input voltage to the analog processing stage and comprising:

a capacitor coupling the analog input voltage to the analog processing stage;

a reference voltage source;

switch means for effecting connections between elements of said referencing circuit;

said switch means including means for connecting the reference voltage source to the capacitor to charge it to a voltage linearly related to the voltage of the reference voltage source and for thereafter disconnecting the capacitor from the reference voltage source;

said switch means including means for connecting the analog input voltage through the capacitor to the integrator during said predetermined interval, said analog input voltage thereby being biased by the capacitor voltage;

means for deriving from the reference voltage source a pair of derivative voltages linearly related thereto;

said switch means including means for connecting one of the derivative voltages to the analog processing stage to form a first reference voltage when the analog input voltage is of one polarity; and said switch means including means for connecting the other of the derivative voltages, in series with the capacitor, to the analog processing stage to form a second reference voltage when the analog input voltage is of the other polarity;

whereby all of the voltages applied to the analog processing stage are directly or linearly referred to a single voltage source and any deviations therein balance one another over the course of an integrating cycle.

2. A bipolar dual ramp analog to digital converter as claimed in claim 1 wherein the deriving means comprises a pair of conductors connected to the terminals of the reference voltage source, whereby the derivative voltages are the voltage of the reference source voltage and ground.

3. A bipolar dual ramp analog to digital converter as claimed in claim 2 wherein the capacitor is charged to the voltage of the reference voltage source, whereby the first and second reference voltages applied to the analog processing stage are twice the voltage of the reference voltage source, and zero, and whereby the converter has the same transfer characteristics for either polarity of the analog input voltage.

4. A bipolar dual-ramp analog-to-digital converter as claimed in claim 1 wherein the deriving means comprises voltage-dividing means connected across the reference voltage source to provide at least one of said derivative voltages as a fraction of the voltage of the reference voltage source.

5. A bipolar dual-ramp analog-to-digital converter of the type arranged to provide a digital output corresponding to the magnitude and polarity of an analog input voltage by means of an analog processing stage having an integrator and comparator, the analog input voltage being applied to the integrator for a predetermined interval, and a reference voltage being applied to the integrator thereafter for a digitally measured interval to restore the integrator to its initial condition, the comparator sensing the return of the integrator to the initial condition and signalling the end of the digitally measured interval, said converter being characterized by a referencing circuit connecting the analog input voltage to the analog processing stage and comprising:

a first voltage input terminal;

a second voltage input terminal;

a capacitor coupling the first voltage input terminal to the analog processing stage;

switch means;

said switch means including means for connecting the voltage at the second voltage input terminal to the capacitor to charge it to a voltage linearly related thereto and for thereafter disconnecting the capacitor from the voltage at the second voltage input terminal;

means for deriving from the voltage at the second voltage input terminal a pair of derivative voltages linearly related thereto;

said switch means including means for connecting one of the derivative voltages to the analog processing stage when the analog input voltage is of one polarity; and said switch means including means for connecting the other of the derivative voltages, in series with the capacitor, to the analog processing stage when the analog input voltage is of the other polarity.

6. A bipolar dual ramp analog to digital converter as claimed in claim 5 wherein the analog input voltage is applied to the first voltage input terminal and a reference voltage source is applied to the second voltage input terminal.

7. In a dual-slope analog-to-digital converter wherein a sample voltage to be converted is applied to an integrator circuit to alter the charge on an integrating capacitor away from a datum level at a rate corresponding to the magnitude of the sample voltage, and wherein a D.C. reference signal is subsequently connected to the integrator circuit to alter the charge on the integrating capacitor reversely towards the datum level at a rate corresponding to the magnitude of the reference signal while a digital output signal is developed in accordance with the time required to reach a predetermined integrator circuit level related to said datum level;

the method of making such conversion for sample signals of either polarity, comprising the steps of:

A. connecting the reference signal source to a ground-isolatable storage device to store therein a signal proportional to the reference signal magnitude;

B. applying to the input of said integrator circuit for a first interval of time a net signal corresponding to the sum of said sample voltage and said stored signal;

C. biasing said integrator during said first time interval by a voltage which opposes and cancels the component of said net signal which corresponds to said stored signal, whereby the resulting applied voltage to said integrator will alter the charge of said integrator capacitor away from said datum level at a rate determined solely by the sample voltage magnitude;

D. determining the polarity of the integrator circuit output produced by the application of said net sample signal thereto; and E. during a second interval of time, and while said integrator remains biased as in step (C), altering the charge on said capacitor back towards said datum level at a predetermined rate by applying to the input of said integrator circuit, selectively in response to the preceding (step D) determination of polarity, either: (1) a first voltage developed from the output of said reference signal source added to said stored signal from said storage device, or (2) a second voltage developed from said storage device without addition of a signal from said reference signal source.

8. The method of claim 7, wherein the bias on said integrator is developed as a voltage on a storage capacitor connected to one terminal of said integrator and provides a voltage component compensating for offset voltage drift.

9. The method of claim 8, wherein said storage capacitor is charged up to said bias voltage during a step preceding step (B) through the application to said integrator of a voltage derived from said reference signal source.

10. A bipolar dual-ramp analog-to-digital converter comprising:

an integrator;

a voltage source providing a first reference voltage;

first and second capacitors;

switch means for establishing interconnections in a controllable sequence;

said switch means including first means for connecting said voltage source to said first capacitor to store therein a signal voltage proportional to that of the voltage source and defining a second reference voltage;

means connecting said second capacitor to the input of said integrator to apply a bias voltage thereto;

said switch means including second means to store in said second capacitor a bias voltage derived from said voltage source;

said switch means including third means operable during a first time interval to connect an applied input voltage in series with said first capacitor to develop a net operating voltage for said integrator, the component of said net operating voltage derived from said first capacitor opposing and cancelling the bias voltage of said second capacitor, whereby said integrator ramps from a datum level at a rate determined solely by the magnitude of said applied input voltage and in a direction determined by the polarity thereof;

means for sensing the polarity of the integrator output with respect to said datum level; and said switch means including fourth means, operable after said first time interval and under the control of said sensing means, to: (1) connect to the input of said integrator a first voltage formed from the series addition of said first and second reference voltages when the integrator output is of one predetermined polarity, and (2) connect to the input of said integrator a second voltage derived from one of said first and second reference voltages when said integrator output is of a polarity opposite to said one polarity.

11. Apparatus as claimed in claim 10, including a buffer amplifier connected between said first capacitor and one input terminal of said integrator.

12. Apparatus as claimed in claim 11, wherein said second capacitor is connected between the other input terminal of said integrator and a circuit ground point; and drift-correct circuit means including means to connect said voltage source to the input of said buffer amplifier to apply a corresponding voltage to said one integrator input terminal, said circuit means further including means to apply a negative feedback signal from the output of said integrator to said other integrator input terminal, the negative feedback action serving to charge up said second capacitor to a bias level corresponding to the voltage then applied to said one integrator input terminal.

* * * * *